(12) United States Patent
Castro (10) Patent No.: US 10,847,220 B2
(45) Date of Patent: Nov. 24, 2020

(54) APPARATUSES AND METHODS FOR BI-DIRECTIONAL ACCESS OF CROSSPOINT ARRAYS

(71) Applicant: Micron Technology, Inc., Boise, ID (US)

(72) Inventor: Hernan A. Castro, Shingle Springs, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/657,876

(22) Filed: Oct. 18, 2019

(65) Prior Publication Data

US 2020/0051625 A1 Feb. 13, 2020

Related U.S. Application Data

(63) Continuation of application No. 15/664,666, filed on Jul. 31, 2017, now Pat. No. 10,482,956, which is a
(Continued)

(51) Int. Cl.
*G11C 11/00* (2006.01)
*G11C 13/00* (2006.01)

(52) U.S. Cl.
CPC ........ *G11C 13/003* (2013.01); *G11C 13/0002* (2013.01); *G11C 13/0004* (2013.01);
(Continued)

(58) Field of Classification Search
CPC ............ G11C 13/0069; G11C 13/0004; G11C 13/0007; G11C 2213/79; G11C 2213/72
(Continued)

(56) References Cited

U.S. PATENT DOCUMENTS 9,324,423 B2 4/2016 Castro
9,741,433 B2 8/2017 Castro
(Continued)

FOREIGN PATENT DOCUMENTS

WO 2013036244 A1 3/2013

OTHER PUBLICATIONS

Japanese Patent Office, "Office Action," issued in connection with Japanese Patent Application No. 2018-223363, dated Dec. 25, 2018 (8 pages).
(Continued)

*Primary Examiner* — Son T Dinh
(74) *Attorney, Agent, or Firm* — Holland & Hart LLP (57) ABSTRACT

The disclosed technology generally relates to apparatuses and methods of operating the same, and more particularly to cross point memory arrays and methods of accessing memory cells in a cross point memory array. In one aspect, an apparatus comprises a memory array. The apparatus further comprises a memory controller configured to cause an access operation, where the access operation includes application of a first bias across a memory cell of the memory array for a selection phase of the access operation and application of a second bias, lower in magnitude than the first bias, across the memory cell for an access phase of the access operation. The memory controller is further configured to cause a direction of current flowing through the memory cell to be reversed between the selection phase and the access phase.

19 Claims, 8 Drawing Sheets

Related U.S. Application Data continuation of application No. 15/076,185, filed on Mar. 21, 2016, now Pat. No. 9,741,433, which is a continuation of application No. 14/272,015, filed on May 7, 2014, now Pat. No. 9,324,423.

(52) U.S. Cl.
CPC .. *G11C 13/0069* (2013.01); *G11C 2013/0073* (2013.01); *G11C 2013/0092* (2013.01); *G11C 2213/76* (2013.01)

(58) Field of Classification Search
USPC ........................................... 365/148
See application file for complete search history.

(56) References Cited

U.S. PATENT DOCUMENTS

| | | | |
|---|---|---|---|
| 2008/0151652 A1 | 6/2008 | Oh et al. | |
| 2009/0207645 A1 | 8/2009 | Parkinson | |
| 2010/0232205 A1 | 9/2010 | Parkinson | |
| 2011/0149628 A1 | 6/2011 | Langtry et al. | |
| 2013/0250654 A1* | 9/2013 | Sugimae | G11C 13/0002 365/148 |
| 2013/0294152 A1 | 11/2013 | Kau et al. | |
| 2013/0294153 A1 | 11/2013 | Dodge | |
| 2014/0362650 A1 | 12/2014 | Castro | |
| 2015/0063021 A1 | 3/2015 | Castro et al. | |
| 2015/0074326 A1 | 3/2015 | Castro | |

OTHER PUBLICATIONS

Japanese Patent Office, "Office Action," issued in connection with Japanese Patent Application No. 2018-223363, dated Jun. 11, 2019 (4 pages).

European Patent Office, "European Search Report," issued in connection with European Patent Application No. 19191145.2, dated Nov. 28, 2019 (9 pages).

* cited by examiner

APPARATUSES AND METHODS FOR BI-DIRECTIONAL ACCESS OF CROSSPOINT ARRAYS

CROSS REFERENCES

The present Application for Patent is a continuation of U.S. patent application Ser. No. 15/664,666 by Castro, entitled "Apparatuses and Methods for Bi-Directional Access of Cross-Point Arrays," filed Jul. 31, 2017, which is a continuation of U.S. patent application Ser. No. 15/076,185 by Castro, entitled "Apparatuses and Methods for Bi-Directional Access of Cross-Point Arrays," filed Mar. 21, 2016, which is a continuation of U.S. patent application Ser. No. 14/272,015 by Castro, entitled "Apparatuses and Methods for Bi-Directional Access of Cross-Point Arrays," filed May 7, 2014, assigned to the assignee hereof, and each of which is expressly incorporated by reference in its entirety herein.

BACKGROUND

Field

The disclosed technology generally relates to memory apparatuses and methods of operating the same, and more particularly to memory arrays having variable resistance materials and methods of accessing memory arrays having variable resistance materials.

Description of the Related Art

Memory devices incorporating variable resistance materials may be used in a wide range of electronic devices, such as computers, digital cameras, cellular telephones, personal digital assistants, etc. Electrical resistance of such variable resistance materials can change between a plurality of resistance states in response to electrical signals, such as, for example voltage or current pulses. In some variable resistance memory devices, sometimes referred to as unipolar memory devices, the electrical resistance of the memory cells can change in response to electrical signals having one polarity. In some other memory devices, sometimes referred to as bipolar memory devices, the electrical resistance of memory cells can change in response to electrical signals having one or two opposite polarities. For example, in a bipolar memory device, the resistance of a memory cell can change in one direction (e.g. from a high resistance to a low resistance) in response to a first electrical signal having a first polarity, and change in an opposite direction (for example, from the low resistance to the high resistance) in response to a second electrical signal having a second polarity opposite to the first polarity. Peripheral circuitry configured to support operation of bipolar memory devices can be larger and more complex compared to unipolar memory devices, due to a need to support current and/or voltage in opposite polarities. Thus, there is a need for apparatuses and methods for efficient accessing of the memory cells in opposite polarities.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings in which:

DETAILED DESCRIPTION

Devices, for example memory devices, incorporating materials that change resistance in operation may be found in a wide range of electronic devices, for example, computers, digital cameras, cellular telephones, personal digital assistants, etc. Such memory devices, sometimes referred to as resistive random access memory (RRAM) devices, can include an array of memory cells, which can be arranged in a cross-point memory array. A cross-point memory array includes columns and rows and a plurality of memory cells disposed at intersection of the columns and rows. In RRAM devices including a cross-point memory array, the resistance of memory cells can change in response to an electrical signal, such as, for example a voltage or a current signal.

In some RRAM devices, sometimes referred to as unipolar memory devices, the electrical resistance of the memory cells can change in response to electrical signals having one polarity. For example, in a unipolar RRAM device, the resistance of a memory cell can change in one direction (e.g. from a high resistance to a low resistance) in response to a first electrical signal having a first polarity, and change in an opposite direction (for example, from the low resistance to the high resistance) in response to a second electrical signal having the same polarity as the first polarity. In some other RRAM devices, sometimes referred to as bipolar memory devices, the electrical resistance of memory cells can change in response to electrical signals having one or two opposite polarities. For example, in a bipolar RRAM device, the resistance of a memory cell can change in one direction (e.g. from a high resistance to a low resistance) in response to a first electrical signal having a first polarity, and change in an opposite direction (for example, from the low resistance to the high resistance) in response to a second electrical signal having a second polarity opposite to the first polarity.

As used herein, the electrical signals that are applied to the memory cells to either write or read are referred to as access signals. Peripheral circuitry configured to support operations of bipolar RRAM devices in opposite polarities can be larger and more complex compared to unipolar RRAM devices, due to a need to support current and/or voltage in opposite polarities. This can be due to, for example, a need to support current and/or voltage for accessing the memory cells in opposite polarities.

While embodiments are described herein with respect to RRAM devices, m particular to RRAM devices, the embodiments can also have application outside the memory array context, for example, switches, antifuses, etc. Similarly, while embodiments are described with respect to memory cells incorporating Ovonic Threshold Switch (OTS) and/or chalcogenide materials, the principles and advantages of the techniques and structures taught herein may be useful for other materials.

Figure 1:
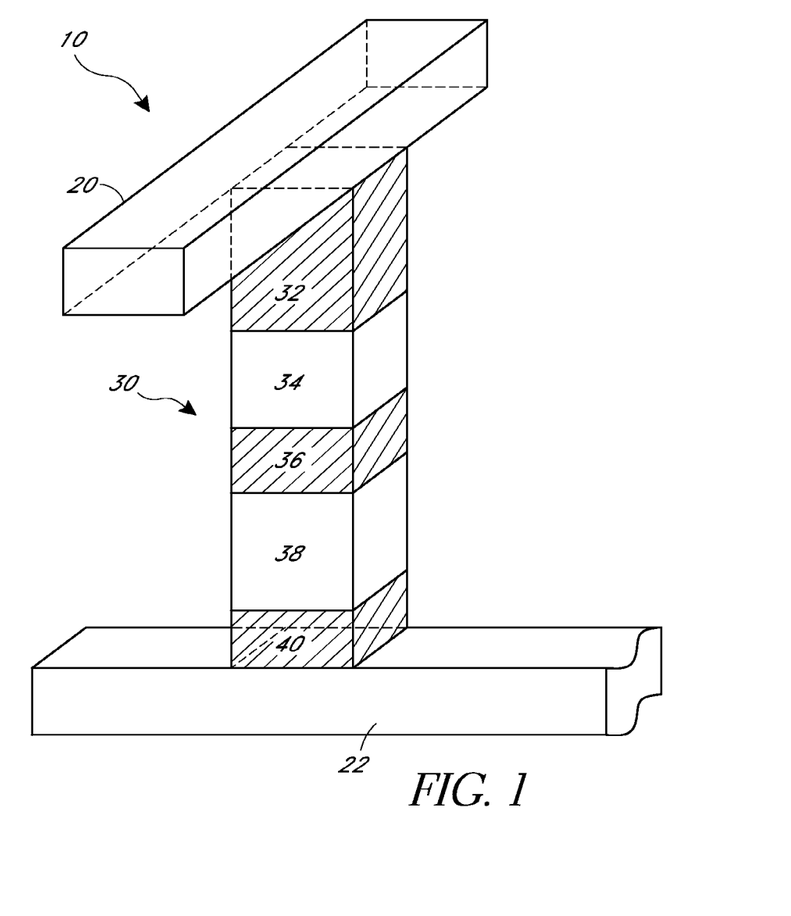
FIG. 1 is a schematic three-dimensional isometric view depicting a memory cell according to some embodiments.

FIG. 1 depicts a memory cell 10 in a cross-point memory array according to some embodiments. The memory cell 10 in FIG. 1 can change between first and second resistance states in response to electrical signals having same or opposite polarities. That is, the memory cell 10 can be a bipolar or a nonpolar memory cell.

While only one memory cell 10 is depicted in FIG. 1 for clarity, it will be appreciated that there can be a plurality of memory cells 10 in a cross-point memory array having a plurality of column lines 20 and a plurality of row lines 22. In the illustrated embodiment, the memory cell 10 includes a storage element 34 and a selector element 38 that are configured to be electrically accessed through a column line 20, which can be a bit line, and a row line 22, which can be a word line. The memory cell 10 is in a stack configuration and can further include a first electrode 32 connecting the column line 20 and the storage element 34, a middle electrode 36 connecting the storage element 34 and the selector element 38, and a second electrode 40 connecting the selector element 38 and the row line 22.

In some embodiments, one or both of the selector element 38 and the storage element 34 can comprise chalcogenide materials. When both the selector element 38 and the storage element 34 both comprise chalcogenide materials, the storage element 34 can comprise a chalcogenide material that can undergo a phase change that is stable and nonvolatile at room temperature. On the other hand, the selector element 38 can comprise a chalcogenide material that does not undergo a similar stable and nonvolatile phase change.

Examples of a phase change-based storage element 34 that can be included m bipolar or unipolar RRAM devices include a phase change material that includes chalcogenide compositions such as an alloy including at least two of the elements within the indium(In)-antimony(Sb)-tellurium(Te) (IST) alloy system, for example, $In_2Sb_2Te_5$, $In_1Sb_2Te_4$, In $1Sb_4Te_7$, etc., an alloy including at least two of the elements within the germanium(Ge)-antimony(Sb)-tellurium(Te) (GST) alloy system, for example, $Ge_8Sb_5Te_8$, $Ge_2Sb_2Te_5$, $Ge_1Sb_2Te_4$, $Ge_1Sb_4Te_1$, $Ge_4Sb_4Te_1$, etc., among other chalcogenide alloy systems. The hyphenated chemical composition notation, as used herein, indicates the elements included in a particular mixture or compound, and is intended to represent all stoichiometries involving the indicated elements. Other chalcogenide alloy systems that can be used in phase change storage nodes include Ge—Te, In—Se, Sb—Te, Ga—Sb, In—Sb, As—Te, Al—Te, In—Ge—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, for example.

Other examples of the storage element 34 that can be included in unipolar or bipolar memory RRAM devices include a metal oxide-based memory storage element (for example, NiO, $HfO_2$, $ZrO_2$, $Cu_2O$, $TaO_2$, $Ta_2O_5$, $TiO_2$, $SiO_2$, $Al_2O_3$), a conductive bridge random access memory (CBRAM) storage element (for example, metal-doped chalcogenide), and/or a spin transfer torque random access memory (STT-RAM) storage element, among other types of storage elements.

Examples of the selector element 38 that can be included in an RRAM device include a two-terminal selector comprising a chalcogenide material, which can sometimes be referred to as an Ovonic Threshold Switch (OTS). An OTS may include a chalcogenide composition including any one of the chalcogenide alloy systems described above for the storage element 34. In addition, the selector element 38 may further comprise an element such as As to suppress crystallization. Examples of OTS materials include Te—As—Ge—Si, Ge—Te—Pb, Ge—Se—Te, Al—As—Te, Se—As—Ge—Si, Se—As—Ge—C, Se—Te—Ge—Si, Ge—Sb—Te—Se, Ge—Bi—Te—Se, Ge—As—Sb—Se, Ge—As—Bi—Te, and Ge—As—Bi—Se, among others.

Still referring to FIG. 1, the memory cell 10 may be in a resistance state that may be a relatively high resistance state (HRS), also known as the RESET state, or a relatively low resistance state (LRS), also known as the SET state. The RESET and SET states can have a resistance ratio between, for example, two and 1 million.

As used herein, a program access operation, which for an RRAM device can also be referred to as a RESET access operation, changes the memory cell from a SET state to an a RESET state. On the other hand, an erase operation, which for an RRAM device can also be referred to as a SET access operation, changes the memory cell from a RESET state to a SET state. However, the terms "program" and "erase" as they relate to RESET and SET access operations may be used interchangeably to mean the opposite.

In addition, while SET and RESET states may herein be used to refer to states of a memory cell (which may include storage and/or selector elements) as a whole, it will be understood that the distinction between SET and RESET states of the memory cell can originate from the resistance difference of the storage element.

Figure 2:
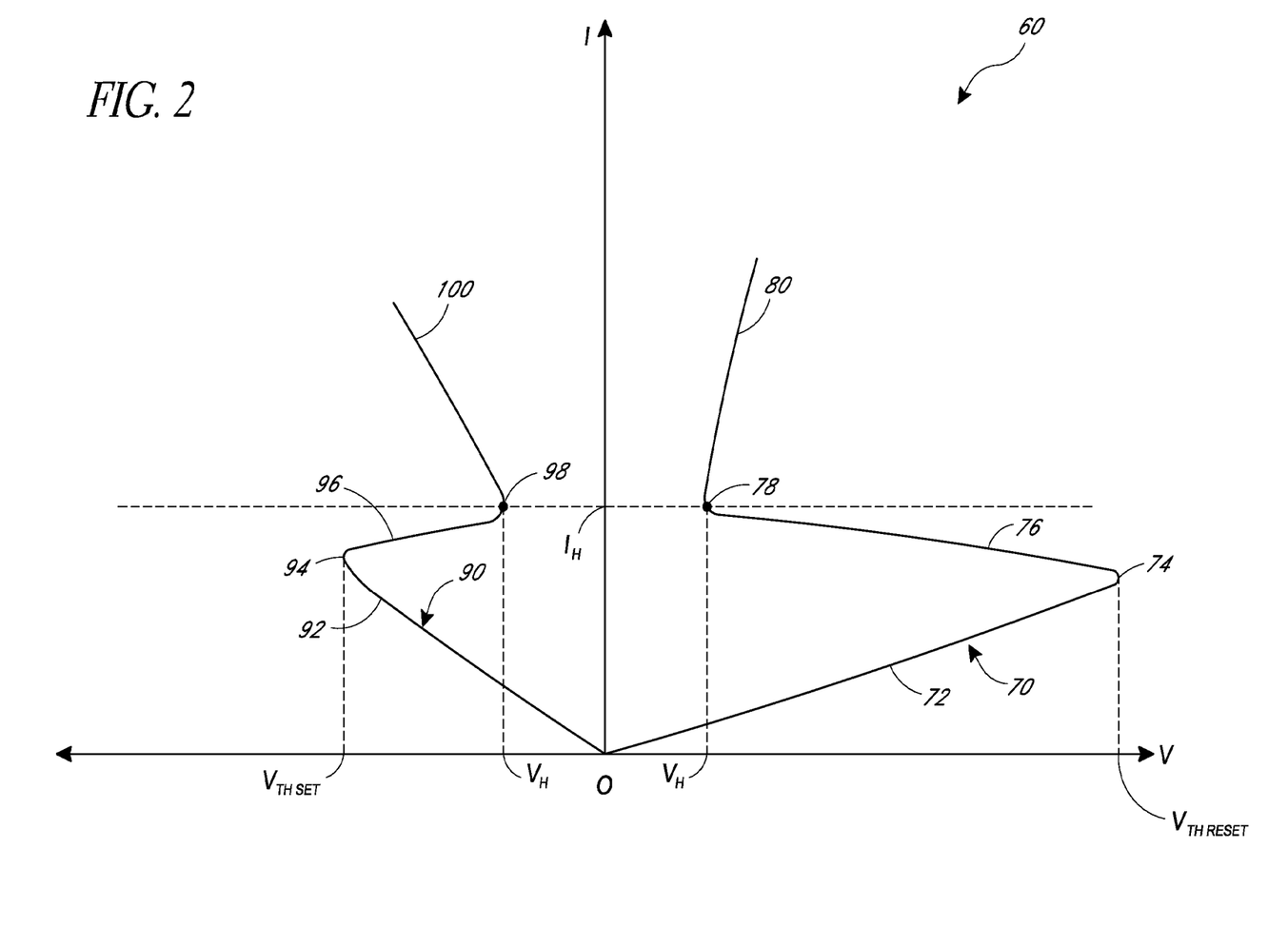
FIG. 2 is a chart illustrating current versus voltage relationship of a memory cell according to some embodiments.

FIG. 2 is a chart illustrating current-voltage (I-V) curves 60 of a memory cell undergoing SET and RESET transitions according to some embodiments. The x-axis represents voltage applied across a phase change memory cell and the y-axis represents absolute value of the current displayed in log scale. The I-V curves 60 can correspond to that of a bipolar memory cell, in which a SET operation can be performed in a first polarity (positive) and a RESET operation can be performed in a second polarity (negative). In addition, the I-V curves 60 can correspond to the memory cell similar to memory cell 10 of FIG. 1, where at least one of the storage element 34 or the selector element 38 includes a chalcogenide material. When the memory cell includes a chalcogenide material, switching events (i.e., SET and/or RESET transitions) can include a thresholding event, which can be accompanied by a snap-back event, as described in more detail below.

A SET transition I-V curve 70 represents the memory cell undergoing a transition from a RESET state to a SET state, while a RESET transition I-V curve 90 represents a phase change memory cell undergoing a transition from a SET state to a RESET state. Although not captured in the IV curve, the transition from SET to RESET or RESET to SET state may involve a duration component or a waveform of voltage or current over time.

The SET transition I-V curve 70 includes a RESET state subthreshold region 72 characterized by a relatively slow-varying current versus voltage, followed by a SET transition threshold "nose" region 74 at about a positive threshold voltage of the RESET state ($V_{TH\_RESET}$), around which point the SET transition I-V curve 70 undergoes a reversal of slope, followed by a SET transition snap back region 76 characterized by a rapid reduction in the voltage across the memory cell, followed by a SET transition hold region 78 around a hold voltage $V_H$, followed by a SET access region 80, in which either a stable current or voltage can be measured.

Still referring to FIG. 2, the RESET transition I-V curve 90 includes a SET state subthreshold region 92 characterized by a relatively slow-varying current versus voltage, followed by a RESET transition threshold "nose" region 94 at about a negative threshold voltage of the SET state ($V_{TH\_SET}$), around which point the RESET transition 1-V curve 90 undergoes a reversal of slope, followed by a RESET transition snap back region 96 characterized by a rapid reduction in the voltage across the memory cell, followed by a RESET transition hold region 98 around a hold voltage $V_H$, followed by a RESET cell access region 100, in which either a stable current or voltage can be measured.

It will be appreciated that the RESET state has a higher threshold voltage $V_{TH\_RESET}$ compared to the $V_{TH\_SET}$, because the contribution to the voltage drop from the storage element can be greater in the RESET state compared to the SET state. In addition, it will be appreciated that the RESET cell access region 100 has a higher level of voltage drop across the memory cell compared to the SET cell access region 80 for similar amount of current flowing (e.g., passing) through the memory cell, because the contribution to the voltage drop from the storage element can be greater in the RESET state compared to the SET state.

In the illustrated embodiment of FIG. 2, both SET and RESET transition I-V curves 70 and 90 have snap back regions 76 and 96 characterized by rapid reduction in voltages across the memory cell. A snap-back event can be accompanied by a discharge current that flows through the memory cell. The amount discharge current can depend on the capacitance and the resistance of the column line and the row line connected to the memory cell undergoing the snap-back effect. Depending on the values of these capacitances and the resistances, the amount of current and/or the duration of the snap back event can be sufficient to induce a partial or a full phase change in a phase change memory under some circumstances.

In some embodiments, once thresholded, a memory cell such as the memory cell 10 of FIG. 1 can be maintained in the thresholded state represented by SET and RESET cell access regions 80 and 100 in FIG. 2, so long as a current flowing through the memory cell can be maintained above a certain minimum level, which is sometimes referred to as a hold current ($I_H$). On the other hand, when the current flowing through the memory cell is allowed to fall below $I_H$, or "released," the memory cell may be extinguished, i.e., revert back to the unthresholded state. In some embodiments, when the memory cell is released, the threshold voltage ($V_{TH\_RESET}$ or $V_{TH\_SET}$) may not return to the threshold voltage the memory cell had prior to being thresholded. Instead, the threshold voltage may recover gradually, and be characterized by a recovery time, as illustrated below in FIG. 3.

Figure 3:
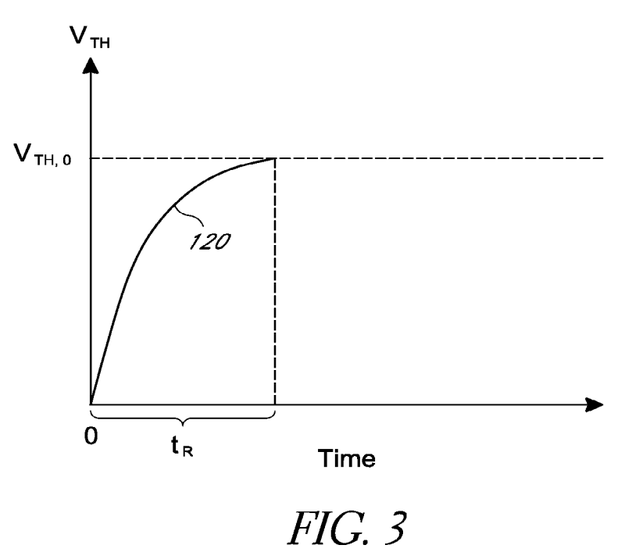
FIG. 3 is a chart illustrating threshold voltage versus time relationship of a memory cell according to some embodiments.

FIG. 3 is a chart illustrating an example threshold recovery curve 120 of a memory cell whose magnitude of the threshold voltage depends on a time lapse ($t_R$) from the moment memory cell is released from a thresholded state. In FIG. 3, the y-axis represents the threshold voltage $V_{TH}$ and the x-axis represents the time lapse from being released from a thresholded state at t=0. The threshold voltage prior to being thresholded is represented as $V_{TH,0}$. As illustrated, after the memory cell is released from the thresholded state at t=0, upon passage of the time lapse $t_R$, the threshold voltage recovers to $V_{TH,0}$, or nearly to $V_{TH,0}$. In some embodiments, the magnitude of the threshold voltage recovers at least 50% of a previous threshold voltage within about 5 microseconds, or within about 500 nanoseconds, or within about 50 nanoseconds.

Figure 4:
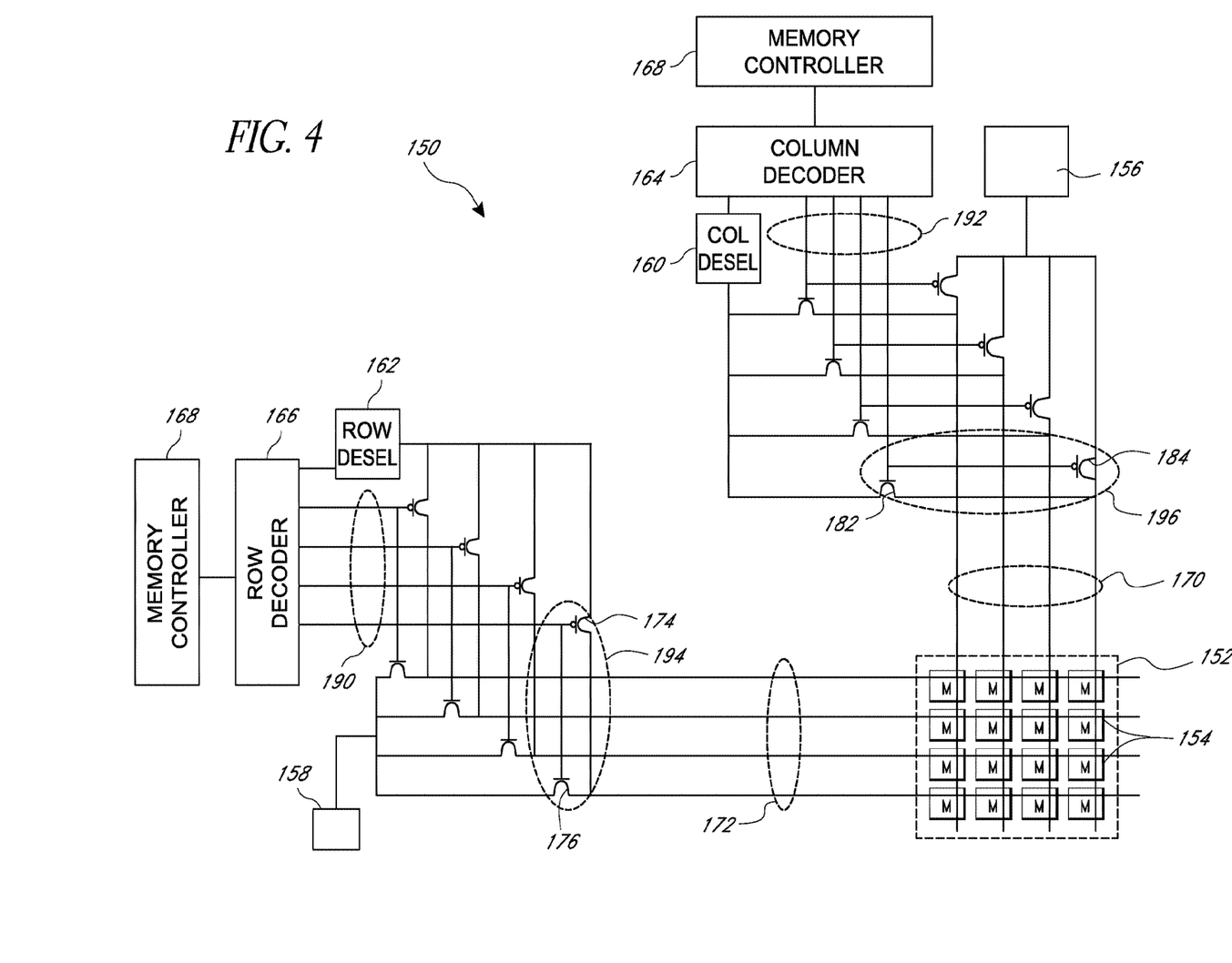
FIG. 4 is a schematic circuit diagram illustrating a memory apparatus according to some embodiments.

FIG. 4 is a schematic circuit diagram of a memory apparatus 150 according to some embodiments. The memory apparatus 150 includes a memory array 152 which comprises a plurality of columns 170 and a plurality of rows 172. The memory array 152 additionally comprises a plurality of memory cells 154 at intersections between columns 170 and rows 172. The memory cells 154 can include, for example, a memory cell 10 described above with respect to FIG. 1. In some implementations, the columns 170 may also be referred to as bit lines or digit lines, and rows 172 may also be referred to as word lines. At least some of the memory cells 154 can be accessed by application of a suitable electrical signal, including, for example, voltage, current or electric field, among others. The memory cells 154 may have an address defined by the row 172 and the column 170 coupled to the memory cell 154.

The memory apparatus 150 additionally includes, according to some embodiments, a column selection circuit (COL SEL) 196 electrically connected to the memory array 152 though the columns 170, and a row selection circuit (ROW SEL) 194 electrically connected to the memory array 152 through the rows 172. In some embodiments, during an access operation, at least some of the rows 172 and at least some of the columns 170 are configured to be activated individually, such that each of the memory cells 154 can be selected in a bit-addressable manner.

The memory apparatus 150 additionally includes, according to some embodiments, a column deselection circuit (COL DESEL) 160 electrically connected to the memory array 152 though the COL SEL 196 and further through columns 170. The memory apparatus 150 additionally includes a row deselection circuit (ROW DESEL) 162 electrically connected to the memory array 152 through the ROW SEL 194 and further through rows 172. In some embodiments, for example during a selection phase (described more in detail with respect to FIGS. 6-8) of an access operation, one or more columns 170 to be selected can be activated via respective COL SEL 196 connected to the columns, and one or more rows 172 to be selected can be activated via respective ROW SEL 194. In some embodiments, for example during an access phase (described more in detail with respect to FIGS. 6-8) of an access operation, one or more columns 170 to be selected can be activated via the COL DESEL 160 connected to the columns, and one or more rows 172 to be selected can be activated via the ROW DESEL 162 connected to the rows 172. In some embodiments, during the selection phase or the access phase of an access operation, one or more columns 170 to be selected as well as one or more unselected columns 170 can be activated via the COL DESEL 160, and one or more rows 172 to be selected as well as one or more unselected rows 172 can be activated via the ROW DESEL 162.

While in FIG. 4, for illustrative purposes only, the COL DESEL 160 is connected to a specific number of columns 170 and the ROW DESEL 162 is connected a specific number of rows 172, in various embodiments, any suitable number of columns 170 can be connected to the COL DESEL 160, and any suitable number of rows 172 can be connected to the ROW DESEL 162. In addition, while in FIG. 4, for illustrative purposes only, a COL SEL 196 is connected to each column 170 and a ROW SEL 194 is connected each row 172, in various embodiments, any suitable number of columns 170 can be connected to a COL SEL 196, and any suitable number of rows 172 can be connected to ROW SEL 194.

Still referring to FIG. 4, according to some embodiments, the memory apparatus 150 additionally includes a column decoder 164 electrically connected to the columns 170 through the COL SEL 196 and the COL DESEL 160, and additionally includes a row decoder 166 electrically connected to the rows 172 through the ROW SEL 194 and the ROW DESEL 162. In operation, for example, a physical address of a memory cell 154 to be accessed may be specified by a memory cell address, which may be included in a memory access command. The memory cell address can include a column address and/or a row address corresponding to the column and the row corresponding to a target memory cell on which an access operation is to be performed. Upon receiving the memory cell address, the column decoder 164 is configured to decode a column address and select or deselect the column by activating either or both the COL SEL 196 or/and the COL DESEL 160. Similarly, upon receiving the memory cell address, the row decoder is configured to decode a row address and select or deselect the row by activating either or both the ROW SEL 194 or/and the ROW DESEL 162.

Still referring to FIG. 4, in some embodiments, the memory apparatus 150 further includes a memory controller 168, which may be configured to control the various access operations performed on the memory array 154, including RESET, SET and READ access operations. In operation, the memory controller 168 can be configured to receive signals from a processor to access one or more memory cells 152 in the memory array 152. The memory controller 168 is in turn configured to transmit control signals to the memory array 154 through the column decoder 164 and the row decoder 166. In some embodiments, the memory controller 168 is integrated as part of the memory apparatus 150 in a solid-state integrated circuit. In other embodiments, the memory controller 168 can be part of a host device.

Still referring to FIG. 4, according to some embodiments, the memory cells 154 can include a variable resistance memory cell comprising a chalcogenide material, similar to the memory cell 10 of FIG. 1. It will be understood that, although the memory apparatus 150 shows a particular number of cells 154, the memory array 152 may contain any suitable number of memory cells 154, and may not have the same number of columns as rows. The memory array 152 can contain, for example, at least many millions of memory cells 154.

Still referring to FIG. 4, the ROW SEL 194 includes a p-type field-effect transistor (PFET) 174 and an n-type field-effect transistor (NFET) 176, according to some embodiments. The PFETs and NFETs can correspond to insulated-gate transistors, such as metal-oxide semiconductor field effect transistors (MOSFETs). While the terms "metal" and "oxide" are present in the name of the device, it will be understood that these transistors can have gates made out of materials other than metals, such as polycrystalline silicon, and can have dielectric "oxide" regions made from dielectrics other than silicon oxide, such as from silicon nitride or high-k dielectrics. The gates of the PFETs 174 and the NFETs 176 may be driven by the row decoder 166 through respective row selection lines 190. The drains of the PFETs 174 and the drains of the NFETs 176 are connected to respective rows 172. Additionally, the sources of the PFETs 174 may be coupled to the ROW DESEL 162, while the sources of the NFETs 176 may be coupled to a row selection voltage source 158.

Similarly, the COL SEL 196 includes a PFET 184 and an NFET 182, according to some embodiments. Similar to ROW SEL 194, the gates of the PFETs 184 and the NFETs 182 may be driven by the column decoder 164 through the respective column selection lines 192. The drains of the PFETs 184 and the drains of the NFETs 182 are connected to the respective columns 170. Additionally, the sources of the PFETs 184 may be coupled to a column selection voltage source 156, while the sources of the NFETs 182 may be coupled to the COL DESEL 160.

Figure 5:
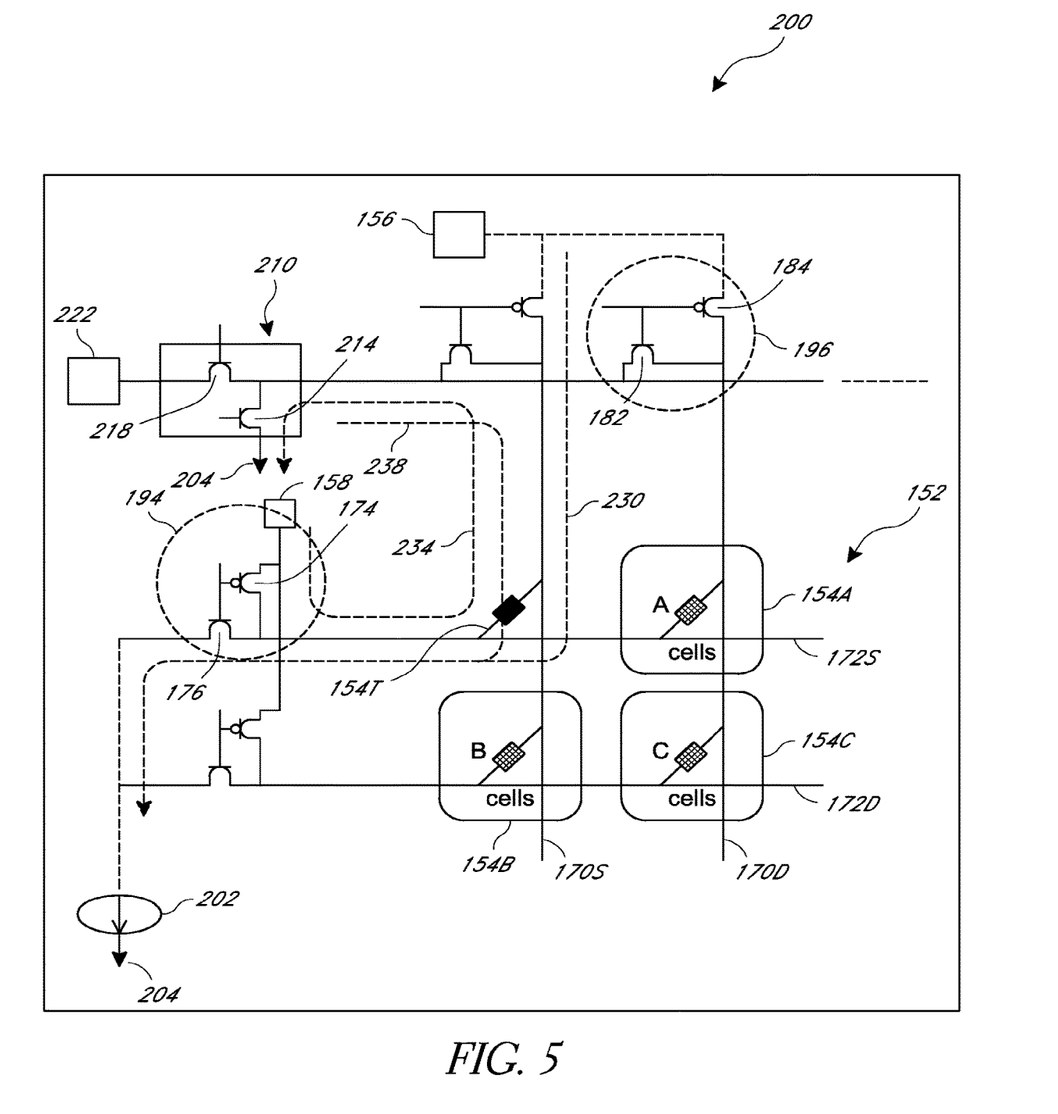
FIG. 5 is a more detailed schematic circuit diagram illustrating a memory device according to some other embodiments.

FIG. 5 is a schematic circuit diagram illustrating a memory device 200 in operation, according to some embodiments. The memory device 200 comprises similar components as the memory apparatus 150 of FIG. 4, including a memory array 152. The memory array 152 includes a plurality of memory cells under various bias configurations in operation. In operation, a target memory cell (T cell) 154T may be accessed through applying appropriate selection and access biases between a selected column 170S and a selected row 172S. As used herein, a memory cell such as a memory cell 154A disposed along the selected row 172S and a deselected column 170D is referred to as an A cell. In addition, a memory cell such as a memory cell 154B disposed along the selected column 170S and a deselected row 172D is referred to as a B cell. In addition, a memory cell such as a memory cell 154C disposed along a deselected column 170D and a deselected row 172D is referred to as a C cell.

Also similar to FIG. 4, the memory device 200 additionally includes a column selection circuit (COL SEL) 196 electrically connected to the memory array 152 though the columns 170S and 170D, and a row selection circuit (ROW SEL) 194 electrically connected to the memory array 152 through rows 172S and 172D. The memory device 200 additionally includes, according to some embodiments, a column deselection circuit (COL DESEL) 210 similar to the COL DESEL 160 of FIG. 4. COL DESEL 210 is electrically connected to the memory array though the COL SEL 196 and further through columns 170S and 170D. In addition, while not illustrated for clarity, the memory device 200 can additionally include a row deselection circuit ROW DESEL similar to the ROW DESEL 162 of FIG. 4.

Also similar to FIG. 4, the COL SEL 196 includes a PFET 184 and an NFET 182, whose gates are connected to a column decoder (not shown), and ROW SEL 194 includes a PFET 174 and an NFET 176, whose gates are connected to a row decoder (not shown).

In some embodiments, as illustrated in FIG. 5, the COL DESEL 210 includes a plurality of switches that may be configured to connect a given column to a suitable voltage source including, for example, a mid-bias column voltage source 222 or a reference voltage source (e.g., ground) 204, depending on whether a memory cell connected to the given column is to be biased positively or negatively. In the illustrated embodiment, the switches include a first PET 214 and a second PET 218, whose drains are connected to the source of the NFET 182 of the COL SEL 196. In addition, the source of the second NFET 218 can be further connected to a mid-bias column voltage source 222 and the source of the first PET 214 may be connected to a reference voltage source, for example, zero volts. In FIG. 5, the COL DESEL 210 including first and second switches is illustrated as having two FETs 214 and 218 that are NFETs. However, the embodiment is not so limited and in some other embodiments, one or both of the first and second FETs can be PFETs. In yet other embodiments, the COL DESEL 210 can include other suitable switching elements, for example, diodes or similar elements.

It will be appreciated that, while in FIG. 5, all columns shown are connected to one COL DESEL 210 for illustrative purposes, the memory device 200 may include any suitable number of columns that can be connected to a COL DESEL 210. For example, in an embodiment, there may be a COL DESEL 210 connected to each column of the memory device 200. In other embodiments, there may be a COL DESEL 210 connected to a suitable fraction of the total number of columns of a given unit of an array, such as, for example, a tile, which can include, for example, about 1024 columns. The number of columns connected to a COL DESEL 210, and thus the number of COL DESEL 210 connected to the array can depend, among other things, the area footprint of the COL DESEL 210 and the amount of current the COL DESEL 210 can be configured to deliver.

In some embodiments, the mid-bias column voltage source 222 can be configured to supply a lower voltage to a column 170S or 170D through COL SEL 196 compared to the column selection voltage source 156. For example, the mid-bias column voltage source 222 can be configured to supply between about 20% and 80% of the voltage supplied to columns 170S or 170D by the column selection voltage source 156. By way of illustration, in some embodiments, the column selection voltage source 156 can be configured to supply a voltage of between about 4V and 8V, for instance about 6V, or between about 3V and 7V, for instance about 5V. In addition, the mid-bias column voltage source 222 can be configured to supply a voltage between about 1V and 5V, for instance about 3V, or between about 0.5V and 4.5V, for instance about 2.5V.

In addition, it will be appreciated that in some embodiments, although not shown in FIG. 5 for clarity, the memory device 200 can include, instead of or in addition to the COL DESEL 210, a row deselection circuit (ROW DESEL similar to the ROW DESEL 162 of FIG. 4) electrically connected to the memory array 152 through the ROW SEL 194 and further through rows 172S and 172S. In operation, the ROW DESEL can be connected to a mid-bias row voltage source (similar to mid-bias column voltage source 222), and can operate in an analogous manner to the COL DESEL 210.

Still referring to FIG. 5, in operation, in some embodiments, the memory device 200 is configured such that a T cell 154T can be accessed via the selected column 170S and the selected row 172S, where the T cell 154T is configured to be switched between first and second resistance states in response to first and second access operations accompanied by currents flowing through the T cell 154T in opposite directions between the selected column 170S and the selected row 172S. For example, the first and second resistance states can be RESET and SET states, respectively, and the first and second access operations can be SET and RESET operations, respectively. Alternatively, the first and second resistance states can be SET and RESET states, respectively, and the first and second access operations can be RESET and SET operations, respectively.

In some embodiments, an access operation, which can be one of SET or RESET operations, comprises a selection phase and an access phase. In these embodiments, performing the access operation on the T cell 154T includes applying a first bias for the selection phase, removal of the first bias, and application of a second bias lower in magnitude than the first bias for the access phase. For example, the first bias, which can be a selection bias, can be applied using a selection phase circuit path 230, by activating the PFET 184 of the COL SEL 196 such that the column selection voltage source 156 supplies a column selection voltage ($V_{COL\_SEL}$) to a first end of the T cell 154T, and activating the NFET 176 of the ROW SEL 196 such that a second end of the T cell 154T is electrically connected to a row selection voltage ($V_{ROW\_SEL}$), e.g., reference voltage 204, through a current limiter 202.

In addition, where the access operation is a SET operation, after removal of the first bias, the second bias, which can be a SET access bias, can be applied using a SET access circuit path 238, by activating the second PET 218 of the COL DESEL 210 such that the mid-bias column voltage source 222 supplies a mid-bias column voltage as the column deselection voltage ($V_{COL\_SEL}$) to the first end of the T cell 154T, and activating the NFET 176 of ROW SEL 194 such that the second end of the T cell 154T is electrically connected to the row selection voltage ($V_{ROW\_SEL}$), e.g., reference voltage 204, through a current limiter 202. It will be appreciated that where the access operation is a SET operation, the direction of the current flow through the T cell 154T is the same between the selection phase and the access phase.

In addition, where the access operation is a RESET operation, after removal of the first bias, the second bias, which can be a RESET access bias, can be applied using a RESET access circuit path 234, by activating the first PET 214 of the COL DESEL 210 such that the first end of the T cell 154T is grounded, and activating the PFET 174 of ROW SEL 194 such that the row selection circuit 194 supplies a deselection voltage ($V_{ROW\_DESEL}$) to the second end of the T cell 154T. It will be appreciated that where the access operation is a RESET operation, the direction of the current flow through the T cell 154T is opposite between the selection phase and the access phase of the RESET operation.

Figure 6:
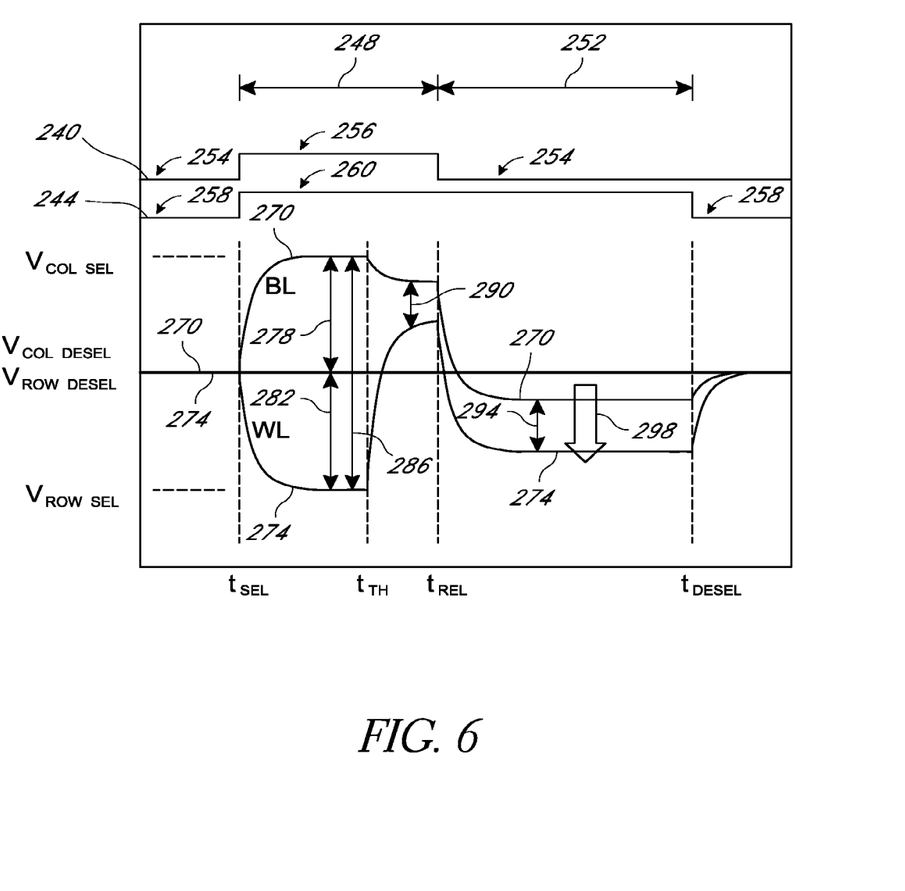
FIG. 6 is a chart illustrating voltage-time curves of columns and rows of a memory array illustrating an access operation according to some embodiments.
Figure 7:
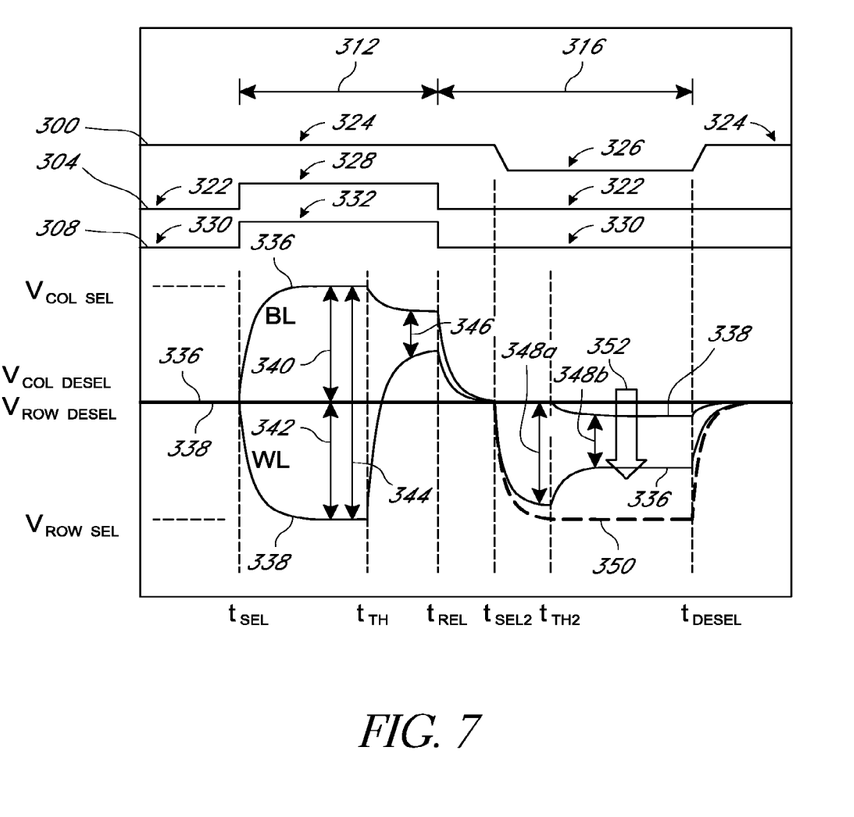
FIG. 7 is a chart illustrating voltage-time curves of columns and rows of a memory array illustrating another access operation according to some embodiments.
Figure 8:
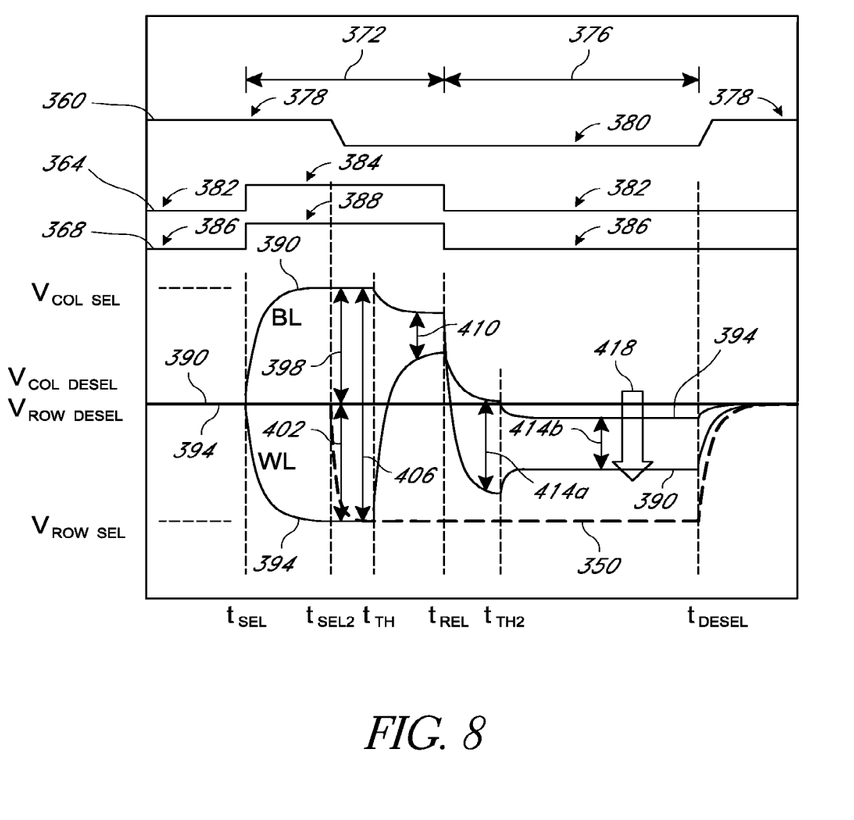
FIG. 8 is a chart illustrating voltage-time curves of columns and rows of a memory array illustrating another access operation according to some other embodiments.

In the following, SET and RESET access operations in opposite polarities for a memory device are described, according to various embodiments. FIGS. 6-8 are charts illustrating voltage-time (V-T) curves of columns and rows of a memory array as a memory cell is accessed, according to various embodiments. In particular, FIGS. 6-8 illustrate accessing a memory cell in a cross-point array, where the memory cell is configured to be switched in response to RESET and SET access operations, where the currents flow through the memory cell in opposite directions, wherein the access operations comprise application of a first bias for a selection phase, removal of the first bias, and application of a second bias lower in magnitude than the first bias for an access phase. In FIGS. 6-8, the x-axis represents time and the y-axis represents voltage.

FIG. 6 illustrates V-T curves of a cross-point memory array in which a SET access operation is performed on a memory cell via a column and a row, according to some embodiments. V-T curves 270 and 274 represent time evolutions of voltages applied on a selected column and a selected row. The SET access operation comprises a selection phase 248 followed by an access phase 252. The selection phase 248 is initiated at a selection time ($t=t_{SEL}$) by a BL selection signal 240 being activated from a deactivated state 254 to an activated state 256, and by a WL selection signal 244 being activated from a deactivated state 258 to an activated state 260. The selection phase 248 ends when the BL selection signal 240 is deactivated back to the deactivated state 254 at a release time (t=$t_{REL}$). The access phase 252 is initiated by the BL selection signal 240 being deactivated at the tREL and ends by the WL selection signal 244 being deactivated at a deselection time (t=$t_{DESEL}$).

Still referring to FIG. 6, according to some embodiments, at time t=0, a plurality of columns and rows of the cross-point memory array, including a column and a row to be selected for accessing a target cell (for example, the T cell 154T in FIG. 5), as well as columns and rows to be inhibited (e.g., for inhibiting the remaining cells, for example, A, B, and C cells 154A, 154B, and 154C in FIG. 5), may be precharged to $V_{COL\ DESEL}$ and VROW DESEL, respectively. The precharge voltages $V_{COL\ DESEL}$ and $V_{ROW\ DESEL}$ may be supplied, for example, by column and row selection voltage sources 156 and 158 described with respect to FIG. 5.

At tSEL, a selection bias 286 can be applied across the T cell by, for example, applying $V_{COL\ SEL}$ on the selected column as indicated by the V-T curve 270 and VROW SEL on the selected row as indicated by the V-T curve 274. The $V_{COL\ SEL}$ can be applied, for example, by using the COL SEL 196 (FIG. 5) to connect the selected column to the column selection voltage source 156 (FIG. 5). The VROW SEL can be applied, for example, by using the ROW SEL 194 (FIG. 5) to connect the selected row to ground 204 (FIG. 5). Upon application of the $V_{COL\ SEL}$ and the VROW SEL to selected column and the selected row, respectively, the T cell may be under a selection bias 286 and a current flows from the selected column through the T cell to the selected row through the selection phase circuit path 230 (FIG. 5). Under this condition, A cells and B cells may be under inhibit biases 282 and 278, respectively. While in the illustrated embodiment, $V_{COL\ DESEL}$ and $V_{ROW\ DESEL}$ are at substantially the same voltage level such that C cells are essentially under zero bias, it will be appreciated that $V_{COL\ DESEL}$ and $V_{ROW\ DESEL}$ can be at different voltage levels such that C cells have a non-zero bias.

The relative magnitudes of $V_{COL\ SEL}$, $V_{ROW\ SEL}$, $V_{COL\ DESEL}$ and $V_{ROW\ DESEL}$ may be chosen to be at suitable voltages depending on the choice of memory and selection elements as well as the desired array biasing approach. In some embodiments, a T cell may be under a bias between about 4V and about 10V, while type A and B cells may be under about 50% the bias of the T cell, for example between about 2V and 5V, and C cells may be under about 0V. In some embodiments, a biasing approach may be chosen such that any suitable selection bias may be applied across the T cell, while the sum of biases across A, B and C approximately equals the selection bias.

After a certain amount of time under which the memory cell has been placed under the selection bias 286, the T cell may threshold at a threshold time (t=$t_{TH}$), which may in turn cause a snap-back discharge current to flow through the memory cell. After the T cell thresholds, the bias across the T cell collapses to a hold level 290, which may correspond to the hold voltage VH described with respect to FIG. 2, and can have a magnitude of, for example between about 0.1V and about 2V, for example about 1V.

At the release time (t=$t_{REL}$), the T cell may be released at least momentarily from the thresholded condition, according to some embodiments. In some embodiments, releasing includes allowing the current flowing though the T cell to fall below a minimum hold current similar to hi described with respect to FIG. 2.

After releasing the T cell at least momentarily from the thresholded condition, a SET access bias 294 may be applied across the T cell according to some embodiments. The SET access bias 294 is applied such that the selected column is at higher potential relative to the selected row such that the current flows from the selected column through the T cell to the selected row. As described above with respect to FIG. 3, after being released from the thresholded condition, the T cell may have a lowered threshold voltage having a magnitude which depends on a time lapsed from t=$t_{REL}$ such that the SET access bias 294 is lower in magnitude than the selection bias 286. The magnitude of the SET access bias 294 can be, for example, less than about 75% of the selection bias 286, less than about 50% of the selection bias 286, or less than about 25% of the of the selection bias 286.

In some embodiments, as illustrated in FIG. 6, the SET access bias 294 is applied immediately after releasing. In other embodiments, there may be a delay before the SET access bias 294 is applied after releasing the T cell. In some embodiments, the SET access bias 294 may be applied within about 5 microseconds, within about 500 nanoseconds, within about 50 nanoseconds, or within about 1 nanosecond.

The SET access bias 294 can be applied across the T cell by, for example, applying a voltage VCOL DESEL on the selected column and grounding the selected row through the SET access circuit path 238 (FIG. 5). It will be appreciated that either of the column selection voltage source 156 or the mid-bias column voltage source 222 illustrated in FIG. 5 may be used for supplying the voltage to the selected column for biasing the T cell under the access bias 294. The voltage can be applied to the selected column, for example, by using the COL SEL 196 (FIG. 5) to connect the selected column to the column selection voltage source 156 (FIG. 5), in which case the current flows through the selection phase circuit path 230 (FIG. 5). Alternatively, the voltage can be applied to the selected column, for example, by using the COL DESEL 210 (FIG. 5) to connect the selected column to the mid-bias column voltage source 222 (FIG. 5), in which case the current flows through the SET access circuit path 238 (FIG. 5). The illustrated embodiment in FIG. 6 corresponds to the current flowing through the SET access circuit path 238 during the access phase 252. It will be appreciated that, during the illustrated SET access operation, the selected column is at a higher voltage relative the selected row during both the selection bias 286 and the access bias 294 such that the direction 298 of current flow is the same between the two biasing conditions, i.e., from the selected column to the selected row. At a deselection time t=$t_{DESEL}$, the selected column and the selected row may be returned to the pre-charging condition, $V_{COL\ DESEL}$ and $V_{ROW\ DESEL}$, respectively to complete the SET access operation.

FIG. 7 illustrates voltage-time curves of a cross-point memory array in which a RESET access operation is performed on a memory cell via a column and a row, according to some embodiments. Voltage-time curves (V-T) 336 and 338 represent time evolutions of voltages on a selected column and a selected row, respectively. The RESET access operation comprises a selection phase 312 followed by an access phase 316. In the illustrated embodiment, the selection phase 312 is initiated at a selection time (t=$t_{SEL}$) by a BL selection signal and a WL signal 304 and 308 being activated from deactivated states 322 and 330, respectively, to activated states 328 and 332, respectively. The selection phase 312 ends and the access phase 316 initiates at a release time (t=$t_{REL}$), when the BL selection signal 304 and the WL signal 308 are deactivated to the deactivated states 322 and 330, respectively. During the access phase 316 at t=$t_{SEL2}$, the column deselection voltage 300 ($V_{COL\ DES}$) is changed from the mid-bias column supply 324 to a reference voltage 326.

The access phase 316 ends when the column deselection voltage 300 ($V_{COL\ DES}$) is changed back to the mid-bias column supply 324 at a deselection time (t=$t_{DESEL}$).

Still referring to FIG. 7, according to some embodiments, the V-T curves 336 and 338 corresponding to a selected column and a selected row, respectively, during the selection phase from time t=0 to t=$t_{REL}$, are qualitatively similar to the V-T curves 270 and 274 of selected column and row, respectively, for the selection phase of the SET access operation described with respect to FIG. 6. Similar to FIG. 6, at t=$t_{TH}$, a target cell (e.g., the T cell 154T in FIG. 5) may be thresholded, and at t=$t_{REL}$, the T cell may be released at least momentarily from the thresholded condition. In some embodiments, the magnitudes of a selection bias 344 in a RESET access operation may be lower than the selection bias 286 (in FIG. 6) in a SET access operation by a voltage difference of for example, between about 0.1V and 2V, or between about 0.5V and 1.5V, for instance about 1V.

Subsequently, a RESET access bias 348a may be applied across the T cell at a second selection time (t=$t_{SEL2}$) according to some embodiments. According to the illustrated embodiment, there may be a delay between releasing the T cell at tREL and applying the RESET access bias 348a at $t_{SEL2}$. Similar to the SET access operation described with respect to FIG. 6, the RESET access bias 348a may be applied within about 5 microseconds, within about 500 nanoseconds, within about 50 nanoseconds, or within about 1 nanosecond at t=tSEL2, from the time of releasing the memory cell at $t_{REL}$.

In some embodiments, after a certain amount of time under which the memory cell has been placed under the RESET access bias 348a, the T cell may threshold for a second time at a second threshold time (t=$t_{TH2}$), which may in turn cause a second snap-back discharge current to flow through the memory cell, whose magnitude is smaller than the snap-back discharge occurring as a result of the snap-back event at t=$t_{TH}$. During the second snap-back event at t=$t_{TH2}$, the direction of current flow is opposite to the direction of current flow during the first snap-back event at t=$t_{TH}$. After the T cell thresholds for the second time at t=$t_{TH2}$, the bias across the T cell may reduce to a post-threshold RESET access bias 348b. Subsequently, similar to the SET access operation described with respect to FIG. 6, at a deselection time t=$t_{DESEL}$, the selected column and the selected row may be returned to the precharging condition, $V_{COL\ DESEL}$ and $V_{ROW\ DESEL}$, respectively, to complete the RESET access operation.

In some embodiments, the voltage can be applied to the selected column, for example, by using the mid-bias column voltage source 222 and COL DESEL 210 (FIG. 5), in which the current flows through the RESET access circuit path 234 (FIG. 5). The illustrated embodiment in FIG. 7 corresponds to the current flowing through the RESET access circuit path 234.

It will be appreciated that, unlike the SET access bias described with respect to FIG. 6, the direction of the bias is reversed between the selection bias 344 and the RESET access bias 348. During application of the selection bias 344, the selected column is at a higher voltage relative to the selected row such that the current flows from the selected column to the selected row. During application of the RESET access bias 348, the selected column is at a lower voltage relative to the selected row such that the current flow is from the selected row to the selected column. Such reversal of the current flow can be caused, for example, by dropping the voltage on the selected column to a low level (for example, grounded at zero volts) using a COL DESEL 210 (FIG. 5) to connect the selected column to ground 204 (FIG. 5) and applying a higher level $V_{ROW\ DESEL}$ (e.g., relative to ground 204) to the selected row. As discussed above, in addition to the selected column, other columns that are deselected can also be connected to the same mid-bias column voltage source 222 (FIG. 5) using the COL DESEL 210 (FIG. 5). The deselected columns can be dropped to the low voltage level 350 (e.g. $V_{ROW\ SEL}$). As discussed above, the number of deselected columns connected to the mid-bias column voltage source 222 can be any suitable number depending on the design of the memory device, for example between 1 and a fraction of columns in a tile. It will be appreciated that while a subset of type A cells along the selected column may also experience a reversal in bias, the subset of cells will experience a snap-back event, because unlike the T cell, the subset of type A cells have not experienced a previous snap-back event at tTH similar to that experienced by the T cell, and therefore the threshold voltages of the subset of type A cells have not been temporarily reduced as that of the T cell, according to the temporary threshold voltage reduction and its recovery effect as described above with respect to FIG. 3.

In some embodiments, the memory controller may be configured to detect a snapback event occurring at tTH, and cause a switching of the column deselection voltage, $V_{COL\ DES}$, for the selected column, from a mid-bias column voltage (supplied by, for example, the mid-bias column voltage source 222 in FIG. 5) to a reference voltage (e.g., ground 204). The detection can be made by current detection or voltage detection circuits and/or using techniques that are designed to detect a voltage or a current event that lasts for a duration of time less than, for example, about 100 ns. In these embodiments where the memory controller can detect the snap back event, the switch from the mid-bias column voltage to the reference voltage can be made conditionally, based on whether or not the snap back event has been detected.

FIG. 8 illustrates voltage-time curves of a cross-point memory array in which a RESET access operation is performed on a memory cell via a column and a row, according to some other embodiments. Voltage-time curves (V-T) 390 and 394 represent time evolutions of voltages on a selected column and a selected row. The RESET access operation comprises a selection phase 372 followed by an access phase 376 that initiates and ends in a manner similar to that of the selection phase 312 and the access phase 316 described with respect to FIG. 7. The sequence of the RESET access operation in FIG. 8 is similar to the sequence of the RESET access operation in FIG. 7 except, unlike FIG. 7, in embodiments represented in FIG. 8, the memory controller may not be configured to detect a snapback event occurring at t=$t_{TH}$, and the mid-bias column supply switch signal 360 is activated from a deactivated state 378 to an activated state 380 during the selection phase 372 at t=$t_{SEL2}$. In these embodiments, similar to FIG. 7, while the voltage supply for the selected column is switched from a column voltage source (for example, COL SEL 196 in FIG. 5) to a mid-bias column voltage source (for example, the mid-bias column voltage source 156 in FIG. 5) between releasing the memory cell at t=$t_{REL}$ and a second threshold time t=$t_{TH2}$, the mid-bias column voltage source is activated at t=$t_{SEL2}$, after selecting the selected column and the selected row at t=$t_{SEL}$. The thresholding event of the target cell may occur before or after t=$t_{SEL2}$. Since by t=$t_{REL}$, the column deselection supply has already switched, the bias across the target cell can transition to the second selection bias 414a without first going into a deactivated state as in FIG. 7. This direct transition may be an advantage according to some embodiments. The subsequent access bias 414b applied to the target cell is similar to that described with respect to FIG. 7

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. A method, comprising:
   applying a first selection bias across a memory cell during a selection phase of a first access operation, the first selection bias having a first polarity;
   applying a first access bias across the memory cell during an access phase of the first access operation, the first access bias having the first polarity;
   applying a second selection bias across the memory cell during a selection phase of a second access operation, the second selection bias having the first polarity;
   applying a second access bias across the memory cell during an access phase of the second access operation, the second access bias having a second polarity.

2. The method of claim 1, wherein the first access operation sets a first logical value of the memory cell and the second access operation sets a second logical value of the memory cell.

3. The method of claim 1, wherein a magnitude of the first access bias is lower than a magnitude of the first selection bias.

4. The method of claim 1, wherein a magnitude of the second access bias is lower than a magnitude of the second selection bias.

5. The method of claim 1, wherein a magnitude of the second selection bias is lower than a magnitude of the first selection bias.

6. The method of claim 1, wherein a magnitude of the second selection bias is equal to a magnitude of the first selection bias.

7. The method of claim 1, wherein a magnitude of the first access bias is lower than a magnitude of the second access bias.

8. The method of claim 1, further comprising:
   activating a first access line selection signal and a second access line selection signal, wherein the first selection bias is applied across the memory cell based at least in part on activating the first access line selection signal and the second access line selection signal; and
   deactivating the first access line selection signal, wherein the first access bias is applied across the memory cell based at least in part on deactivating the first access line selection signal.

9. The method of claim 8, wherein activating the first access line selection signal couples a first access line for the memory cell with a first voltage source, further comprising:
   coupling the first access line with a second voltage source when the first access line selection signal is deactivated, wherein the first access bias is applied across the memory cell based at least in part on coupling the first access line with the second voltage source.

10. The method of claim 1, further comprising:
    grounding a first access line for the memory cell; and
    coupling a second access line for the memory cell with a third voltage source when the first access line is grounded, wherein the second access bias is applied across the memory cell based at least in part on applying the voltage to the second access line.

11. An apparatus, comprising:
    a memory cell;
    a plurality of voltage sources couplable with the memory cell, wherein the plurality of voltage sources are operable to:
       bias the memory cell with a first polarity during a first type of access operation; and
       bias the memory cell with a second polarity during a second type of access operation;
    a first set of one or more switches operable to couple a first end of the memory cell with a first voltage source of the plurality of voltage sources during a first phase of the first type of access operation and a first phase of the second type of access operation, the first voltage source operable to supply a first voltage; and
    a second set of one or more switches operable to couple a second end of the memory cell with a second voltage source of the plurality of voltage sources during the first phase of the first type of access operation and the first phase of the second type of access operation, the second voltage source operable to supply a second voltage that is lower than the first voltage, wherein the first end of the memory cell being at a higher voltage than the second end of the memory cell corresponds to the first polarity.

12. The apparatus of claim 11, further comprising:
    a third set of one or more switches operable to couple the first end of the memory cell with a third voltage source of the plurality during a second phase of the first type of access operation, the third voltage source operable to supply a third voltage that is lower than the first voltage and higher than the second voltage.

13. The apparatus of claim 11, wherein:
    the first set of one or more switches is operable to couple the first end of the memory cell with the first voltage source during a second phase of the first type of access operation; and
    the second set of one or more switches is operable to couple the first end of the memory cell with the first voltage source during the second phase of the first type of access operation.

14. The apparatus of claim 12, wherein:
    the third set of one or more switches is operable to couple the first end of the memory cell with a fourth voltage source during a second phase of the second type of access operation, the fourth voltage source operable to supply a fourth voltage; and
    the second set of one or more switches is operable to couple the second end of the memory cell with a fifth voltage source during the second phase of the second type of access operation, the fifth voltage source operable to supply a fifth voltage that is higher than the fourth voltage.

15. The apparatus of claim 14, wherein the second voltage source and the fourth voltage source both comprise a ground reference.

16. The apparatus of claim 14, wherein the second voltage is equal to the fourth voltage.

17. An apparatus, comprising:
    a memory cell; and
    a memory controller coupled with the memory cell, the memory controller operable to cause the apparatus to:

apply a first selection bias across the memory cell during a selection phase of a first access operation;

apply a first access bias across the memory cell during an access phase of the first access operation, the first access bias having a first polarity;

apply a second selection bias across the memory cell during a selection phase of a second access operation;

apply a second access bias across the memory cell during an access phase of the second access operation, the second access bias having a second polarity.

18. The apparatus of claim 17, wherein the memory controller is configured to:

write a first state to the memory cell based at least in part on applying the first access bias across the memory cell; and write a second state to the memory cell based at least in part on applying the second access bias across the memory cell.

19. The apparatus of claim 17, wherein the first selection bias and the second selection bias have the first polarity.

* * * * *